United States Patent
Krawczyk, Jr. et al.

(10) Patent No.: US 6,744,325 B2
(45) Date of Patent: Jun. 1, 2004

(54) QUADRATURE RING OSCILLATOR

(75) Inventors: Thomas W. Krawczyk, Jr., Redondo Beach, CA (US); David A. Rowe, Torrance, CA (US)

(73) Assignee: Sierra Monolithics, Inc., Redondo Beach, CA (US)

( * ) Notice: Subject to any disclaimer, the term of this patent is extended or adjusted under 35 U.S.C. 154(b) by 12 days.

(21) Appl. No.: 10/115,400

(22) Filed: Apr. 3, 2002

(65) Prior Publication Data

US 2003/0189467 A1 Oct. 9, 2003

(51) Int. Cl.[7] .................................. H03B 27/00
(52) U.S. Cl. .............. 331/57; 331/117 R; 331/56; 331/45; 331/177 R; 331/135; 375/376
(58) Field of Search ............... 331/57, 117 R, 331/56, 45, 177 R, 135; 375/376

(56) References Cited

U.S. PATENT DOCUMENTS

| 4,884,041 A | 11/1989 | Walker ................. 331/57 |
| 5,475,344 A | 12/1995 | Maneatis et al. ........ 331/57 |
| 5,592,126 A | 1/1997 | Boudewijns et al. ..... 331/45 |
| 5,592,127 A | 1/1997 | Mizuno ................ 331/57 |
| 5,841,325 A | 11/1998 | Knotts et al. .......... 331/57 |
| 6,396,360 B1 * | 5/2002 | Cai .................. 331/108 B |

OTHER PUBLICATIONS

Rofougaran, Ahmadreza et al., "A 900MHz CMOS LC–Oscillator with Quadrature Outputs", ISSCC96, Session 24, Analog Techniques, Paper SP24.6, pp. 392–393.

Kim, Jae Joon et al., "A Low–Phase–Noise CMOS LC Oscillator with a Ring Structure", ISSCC2000, Session 26, Analog Techniques, Paper WP26.3, pp. 430–431.

Matsuoka, Hiroto et al., "A 5–GHz Frequency–Doubling Quadrature Modulator with a Ring–Type Local Oscillator", IEEE Journal of Solid–State Circuits, vol. 34, No. 9, Sep. 1999, pp. 1345–1348.

Sun, Lizhong et al., "A Quadrature Output Voltage Controlled Ring Oscillator Based on Three–Stage Sub–Feedback Loop", IEEE 1999, pp. II, 176–179.

Wu, Chung–Yu et al., "A 1.8GHz CMOS Quadrature Voltage–Controlled Oscillator (VCO) Using the Constant–Current LC Ring Oscillator Structure", IEEE 1998, pp. IV, 378–381.

(List continued on next page.)

*Primary Examiner*—Arnold Kinkead
(74) *Attorney, Agent, or Firm*—Hogan & Hartson L.L.P.

(57) ABSTRACT

A quadrature ring oscillator for high clock-rate applications is disclosed. A quadrature LC ring oscillator may use two stages of LC oscillators and variable mixers to provide consistent oscillation even at high clock rates. One stage of the quadrature ring oscillator comprises a first resonating element having an input and an output, and a first variable summer having L and P inputs and an output, with its L input being connected to the output of the first resonating element. The output of the first variable summer is connected to the input of the first resonating element The first variable summer may generate its output at a first phase by combining the L and P inputs. A second stage of the LC ring oscillator comprises a second resonating element, which has an input and an output, with its output being connected to the P input of the first variable summer. An inverter is used to produce an inverted signal of the output of the first resonating element. This stage also comprises a second variable summer having L and P inputs and an output, with its output connected to the input of the second resonating element. The P input of this second variable summer is connected to the inverted signal from the inverter and the L input is connected to the output of the second resonating element. The second variable summer may generate its output at a second phase by combining its L and P inputs.

24 Claims, 7 Drawing Sheets

OTHER PUBLICATIONS

Banu, Mihai, "MOS Oscillators with Multi-Decade Tuning Range and Gigahertz Maximum Speed", IEEE Journal of Solid-State Circuits, vol. 23, No. 6, Dec. 1988, pp. 1386–1393.

Enam, S.K. et al., "A 300-MHz CMOS Voltage-Controlled Ring Oscillator", IEEE Journal of Solid-State Circuits, vol. 25, No. 1, Feb. 1990, pp. 312–313.

* cited by examiner

Fig. 4
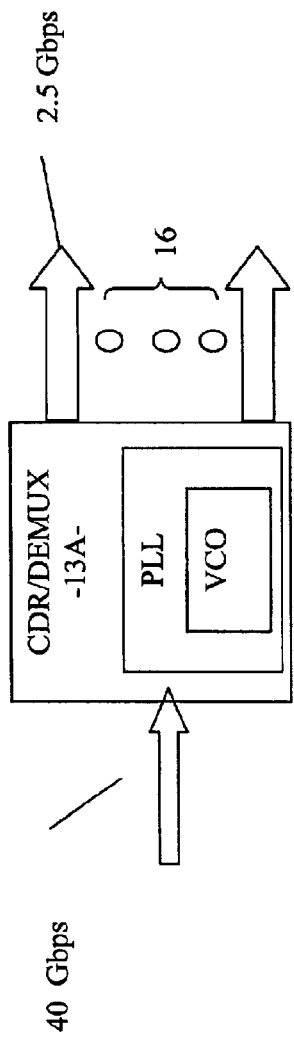
Fig. 5
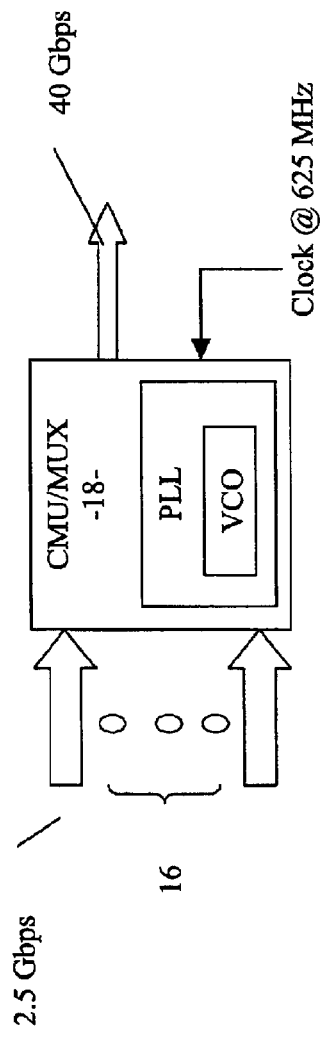
Figs. 6 (a) & (b)
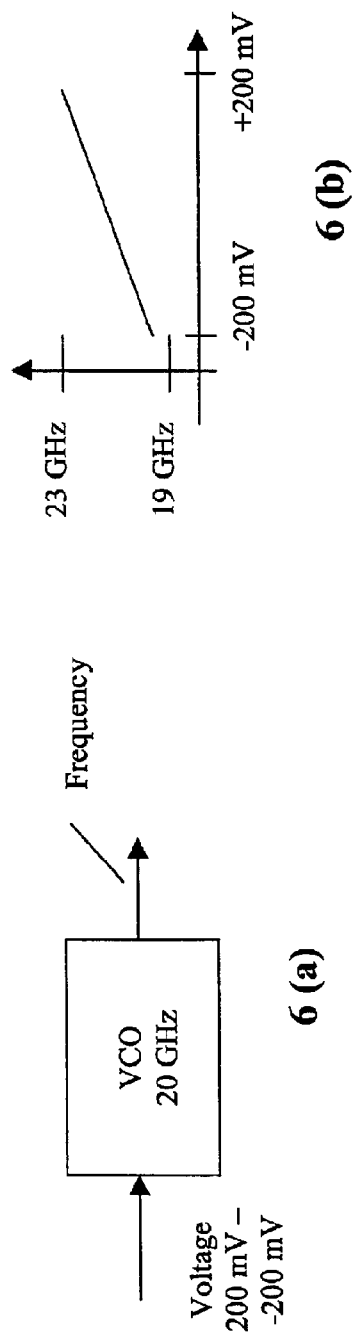

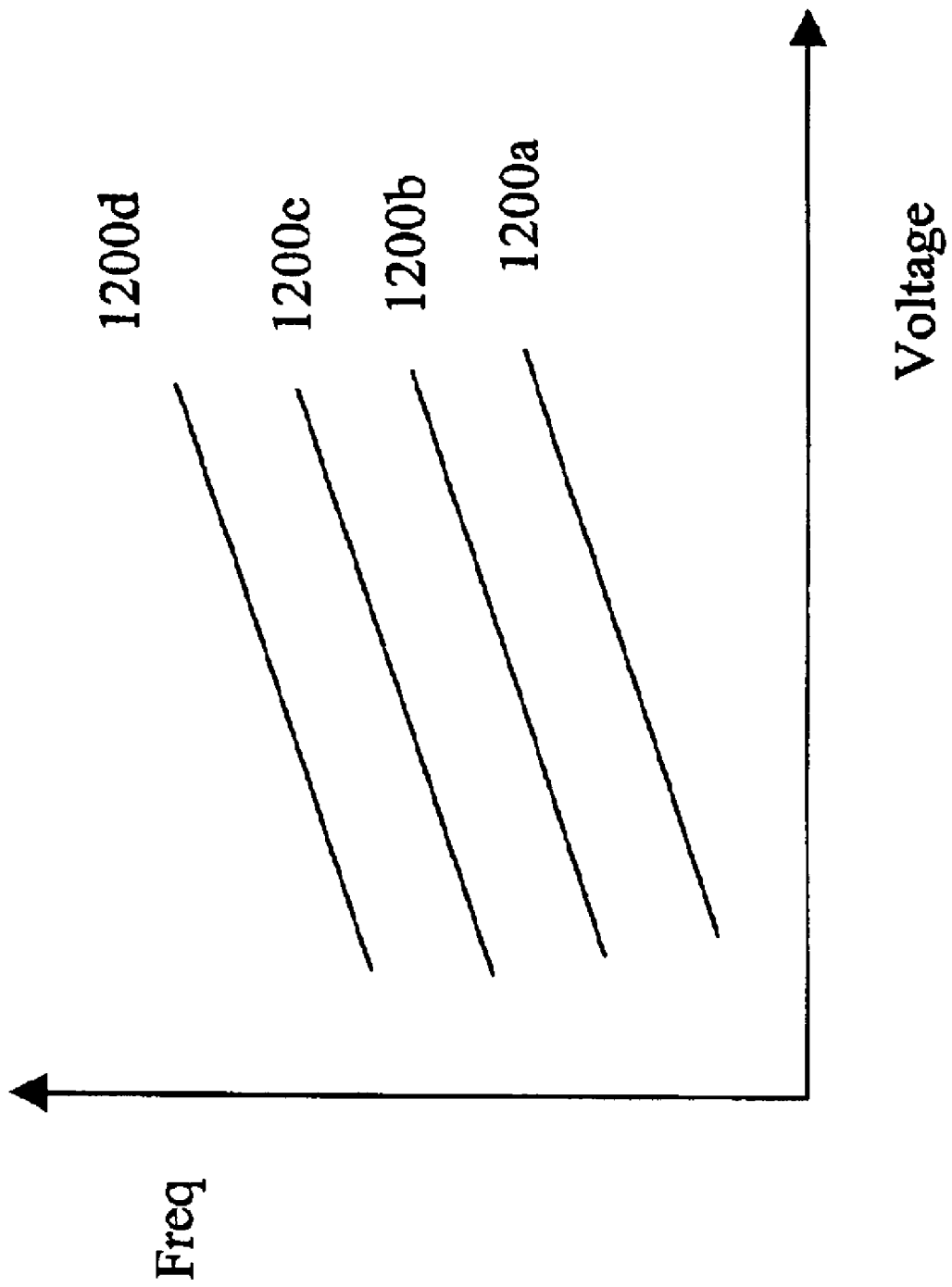

QUADRATURE RING OSCILLATOR

FIELD OF THE INVENTION

The present invention relates to phase locked loop ("PLL") circuits and clock sources, and more particularly to ring oscillators for high-speed communications.

ART BACKGROUND

Recently, the world has witnessed a phenomenal growth both in the number of web users, applications and devices, and in the amount of data traffic, especially that of medium-rich content—all demanding high speed communications and connectivity over the global information network. To accommodate this surge in bandwidth demand, network carriers have begun to provide ultra high rate fiber optical channels. While data transmission can be done using fiber optical channels, the processing of such data still involves the handling of electrical signals.

In order to produce clock signals for processing data, conventional LC oscillators have been used. It has been well known that while a conventional LC oscillator may produce signals which have low noise and high quality, it suffers from having a narrow tuning range. A simplified diagram of a conventional LC oscillator is illustrated in FIG. 1. As shown, LC oscillator 50 includes resistor 520, capacitor 530, inductor 540 and its sustaining circuit 510. To be able to change the frequency, capacitor 530 is implemented by a varactor, which is a variable capacitor. The frequency, f, of LC oscillator 50 can be calculated by: f=1/squareroot(LC).

Another type of a conventional oscillator is a ring oscillator 60, a simplified diagram of which is shown in FIG. 2. It has been known that while these ring oscillators can achieve a wide tuning rage, they produce high noise. As shown, ring oscillator 60 has many stages and a number of inversions. The frequency of ring oscillator 60 is represented by: $f=1/(2 \cdot N \cdot T_d)$, where "N" is the number of stages, and "$T_d$" is the delay through the stage. As an example, to achieve a frequency of 20 GHz, each stage of ring oscillator 60 should have a delay of 6.25 ps, based on: 1/(2·4·6.25 ps)=20 GHz.

While a conventional oscillator may work in low clock rate applications, it does not work well in high clock rate (e.g., 10 GHz or above) applications used for modern communication applications. One of the reasons for this drawback lies in the varactor component of the oscillator. A varactor, which is a variable capacitor, allows the frequency of a typical oscillator, such as an inductor/capacitor ("LC") oscillator, to change based on the formula: f=1/squareroot (LC). When the capacitance is changed, the frequency of the oscillator can be changed as well. However, a varactor in a conventional oscillator has a small range such that it limits the range of the oscillator's frequency. Additionally, at high frequencies, the parasitic capacitance of the oscillator's interconnects and devices play a much larger role, percentage-wise, and tend to reduce the effective capacitive range of the varactors. In addition, a varactor can be noisy and lossy.

The limitation imposed by the varactor makes the manufacturing of oscillators a challenge, since its frequency range cannot be kept consistent, especially when they are in volume production. The lack of consistency, which produces a poor yield, makes it undesirable for those skilled in the art to include a varactor in an oscillator for high clock rate applications.

Some have attempted to solve the problems brought on by the varactors by using multiple oscillators on the chip to cover different ranges of frequency. The rationale was that since the varactors tend to shift together, one of the oscillators will have the desired range and can be picked—on the fly. As can be appreciated by those skilled in the art, such a solution has become more complicated than the problem it is intended to solve.

Therefore, it is desirable to be able to achieve wide frequency ranges for an oscillator for high clock rate applications in a consistent manner.

It is also desirable to be able to consistently achieve wide frequency ranges for an oscillator without a varactor for high clock rate applications.

SUMMARY OF THE INVENTION

A quadrature ring oscillator for high clock-rate applications is disclosed. In accordance with one embodiment of the present invention, a quadrature LC ring oscillator of the present invention may use two stages of LC oscillators and variable mixers to provide consistent oscillation even at high clock rates. One stage of the quadrature LC ring oscillator comprises a first resonating element having an input and an output, and a first variable summer having L and P inputs and an output, with its L input being connected to the output of the first resonating element. The output of the first variable summer is connected to the input of the first resonating element. The first variable summer is adapted to generate its output at a first phase by combining the L and P inputs. A second stage of the LC ring oscillator comprises a second resonating element, which has an input and an output, with its output being connected to the P input of the first variable summer. An inverter is used to produce an inverted signal of the output of the first resonating element. This stage also comprises a second variable summer having L and P inputs and an output, with its output connected to the input of the second resonating element. The P input of this second variable summer is connected to the inverted signal from the inverter and the L input is connected to the output of the second resonating element. The second variable summer is adapted to generate its output at a second phase by combining its L and P inputs.

In another embodiment of the present invention, each stage of the LC ring oscillator is of implemented by a differential LC tank and a variable summer with differential input and differential output signals and current sources.

BRIEF DESCRIPTION OF THE DRAWINGS

FIG. 4 illustrates a simplified diagram of a CDR/Demux used in a network interface.

FIG. 5 illustrates a simplified diagram of a CMU/Mux used in a network interface.

FIGS. 6(a) and (b) illustrate a simplified diagram of an exemplary VCO and its frequency-voltage characteristic curve.

FIG. 12 illustrates a frequency-vs.-voltage characteristic curve of an exemplary clock generator having a band switching capability in accordance with one embodiment of the present invention.

DETAILED DESCRIPTION OF THE PRESENT INVENTION

A quadrature LC ring oscillator is disclosed. The quadrature LC ring oscillator of the present invention provides a consistent voltage-controlled oscillator for high clock rate applications, without the use of a varactor. In the following detailed description, numerous specific details are set forth to provide a full understanding of the present invention. It will be obvious, however, to one ordinarily skilled in the art that the present invention may be practiced without some of these specific details. In other instances, well-known structures and techniques have not been shown in detail so as to avoid unnecessarily obscuring the present invention.

Figure 1:
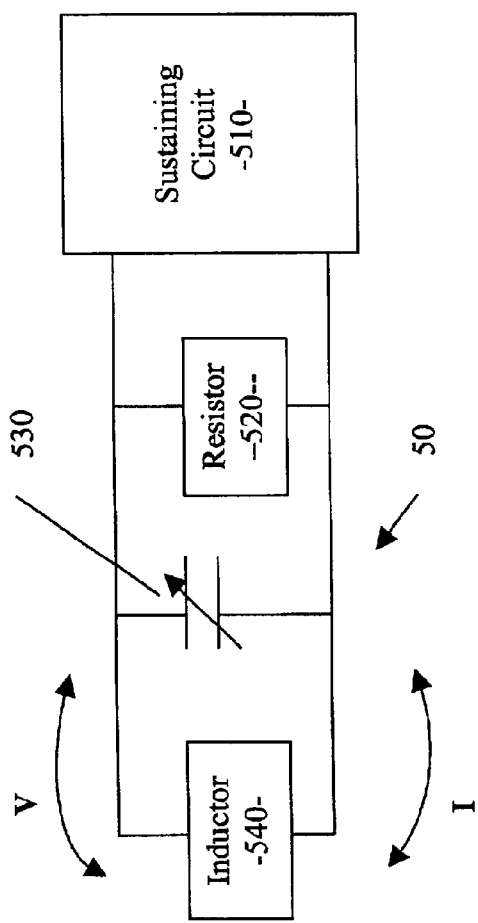
FIG. 1 illustrates a simplified diagram of a conventional LC oscillator.
Figure 2:
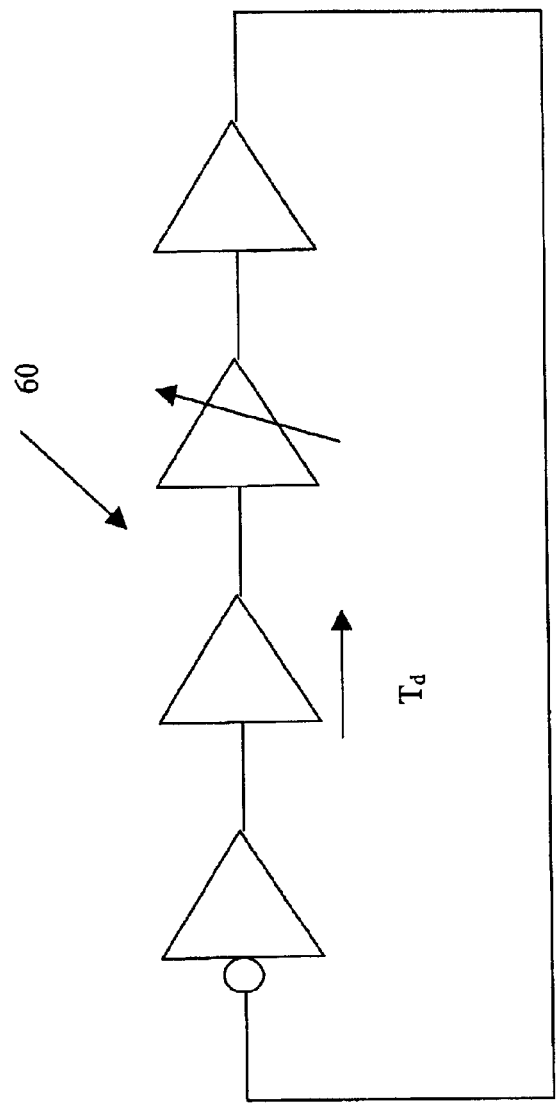
FIG. 2 illustrates a simplified diagram of a conventional ring oscillator.
Figure 3:
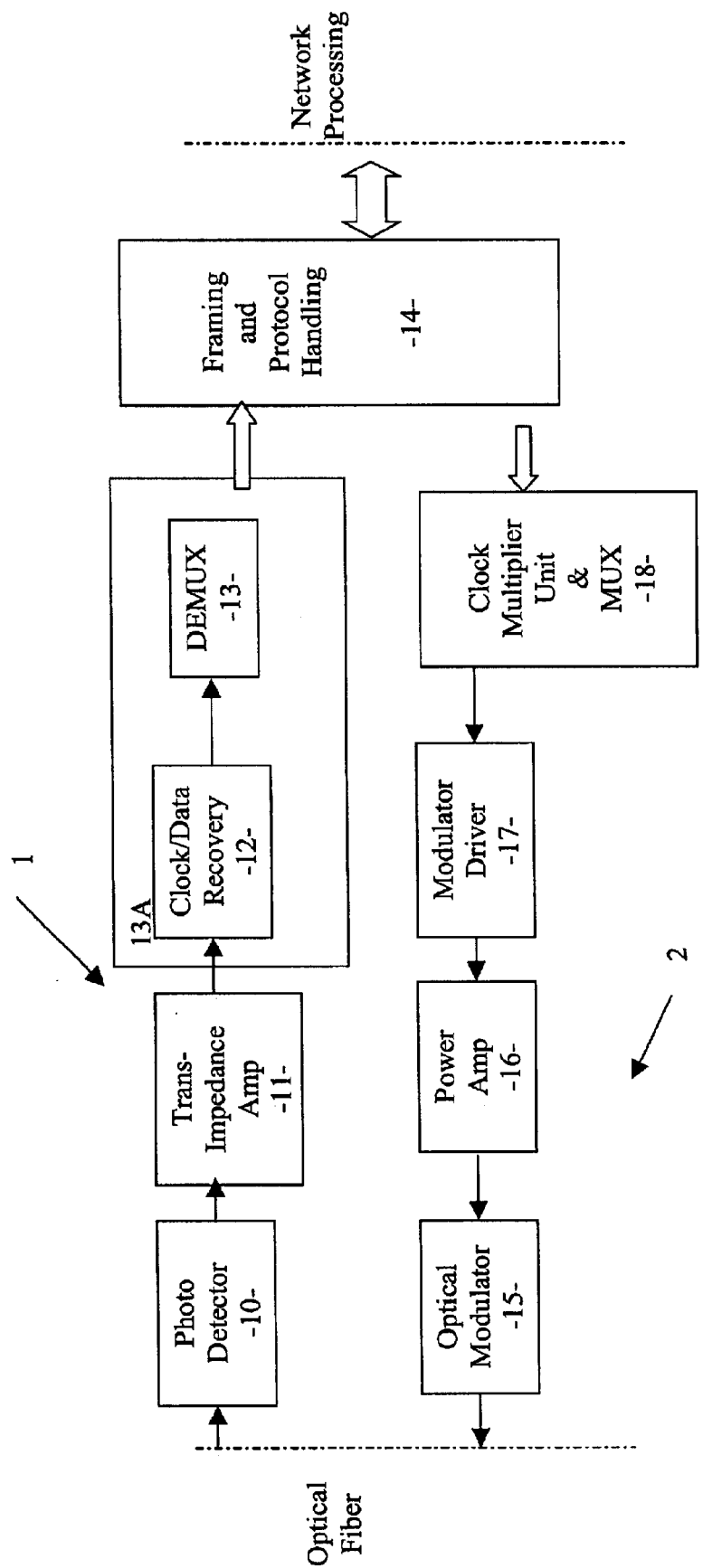
FIG. 3 illustrates a simplified block diagram of an exemplary network interface unit.

To handle the conversion between electrical signals and optical signals, a network interface unit can be used. FIG. 3 illustrates a simplified diagram of an exemplary network interface unit. At receiver side 1, optical signals sent from the fiber optical channels are detected by detector 10 and amplified by trans-impedance amplifier 11. After optical/electrical conversion and amplification, clock and data signals are recovered by clock/data recovery unit ("CDR") 12. The serial data signals are demultiplexed, or deserialized, by a demultiplexer "Demux") 13 to lower-speed parallel data streams, e.g., from a single stream of 40 Gbps down to 16 2.5 Gbps streams. The lower-speed data streams are then forwarded to framing and e protocol handling unit 14, which prepares the data for network processing. While the units 12 and 13 are shown as two units, they may be shown as one unit (e.g., CDR/Demux unit 13A).

At transmitter side 2, parallel data signals generated from network processing are multiplexed up to a higher speed serial data (e.g., 40 Gbps) by Clock Multiplier Unit/Multiplexer unit ("CMU/Mux") 18. While the CMU and Mux unit are shown as one unit (e.g., CMU/Mux unit), they may be shown as two units (e.g., CMU unit and Mux unit). CMU/Mux 18 (e.g., CMU) also multiplies the data clock speed up to the serial data rate, or a fraction thereof. The serial data signals are then amplified by modulator driver 17 and power amplifier 16 to a level sufficient to drive optical modulator 15 for transmission by the optical channels.

CDR/Demux 13A and CMU/Mux 18 circuits of FIG. 3 generally use a phase-locked loop ("PLL") and voltage-controlled oscillator ("VCO") to help lock in the frequency of its signals. A simplified diagram of CDR/Demux 13A and CMU/Mux 18 is illustrated in FIG. 4 and FIG. 5, respectively. In FIG. 4, as an example, CDR/Demux 13A is shown to include a PLL and VCO for deserializing a 40 Gbps stream to 16 2.5 Gbps streams. In FIG. 5, as an example, 16 of 2.5 Gbps data streams are serialized to form the serial 40 Gbps data stream, aided by the 625 MHz system clock. It should be noted that the invention is not limited to these frequencies.

The VCO in both CDR/Demux 13A and CMR/Mux 18 generates an oscillating signal based on, among others, the voltage of its input. A simplified diagram of a VCO and its frequency-voltage curve is illustrated in FIGS. 6(a) and (b), respectively. As illustrated, an exemplary VCO may generate an output with a frequency bandwidth between 19 GHz and 23 GHz, based on an input voltage swing of −200 mV and +200 mV. A VCO provides essentially the "heartbeat" that keeps the signals going.

However, a VCO, like all other high-speed electronic circuits, has its performance limitations. As high-speed signals are received by a Demux, or by a Mux, their frequencies tend to drift, for example, from 39.9 GHz or 40.1 GHz. While the exact frequency is not known, the VCO must lock to the frequencies of the incoming signals of the Mux or Demux, as the case may be. To do that, the VCO needs to be able to move its frequency around as the signal frequency moves.

Figure 7:
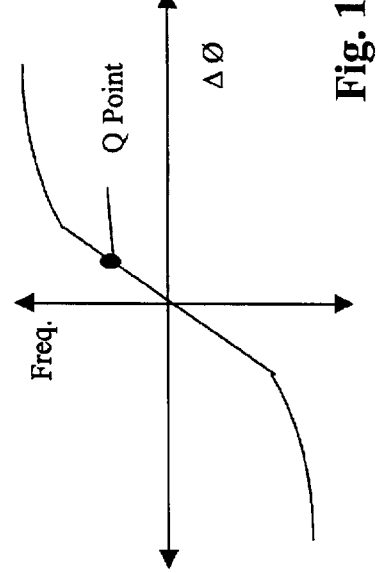
FIG. 7 illustrates a frequency-vs.-phase difference graph of a conventional LC oscillator.

With reference to FIG. 7, LC oscillator 50 typically has a 0° phase difference between its current I and voltage V, i.e. $\Delta\emptyset=0°$, by virtue of its feedback that keeps the phase unchanged. However, if $\Delta\emptyset$ is changed, the frequency of LC oscillator 50 changes with it, as shown in the simplified frequency-$\Delta\emptyset$ curve of FIG. 7. Therefore, by adding a phase-adjusting feedback to an LC oscillator, the phase difference can be changed, thus allowing the Q-Point to move along the curve and causing the frequency to change accordingly. The following discussion in connection with FIG. 8 will illustrate this advantage.

Figure 8:
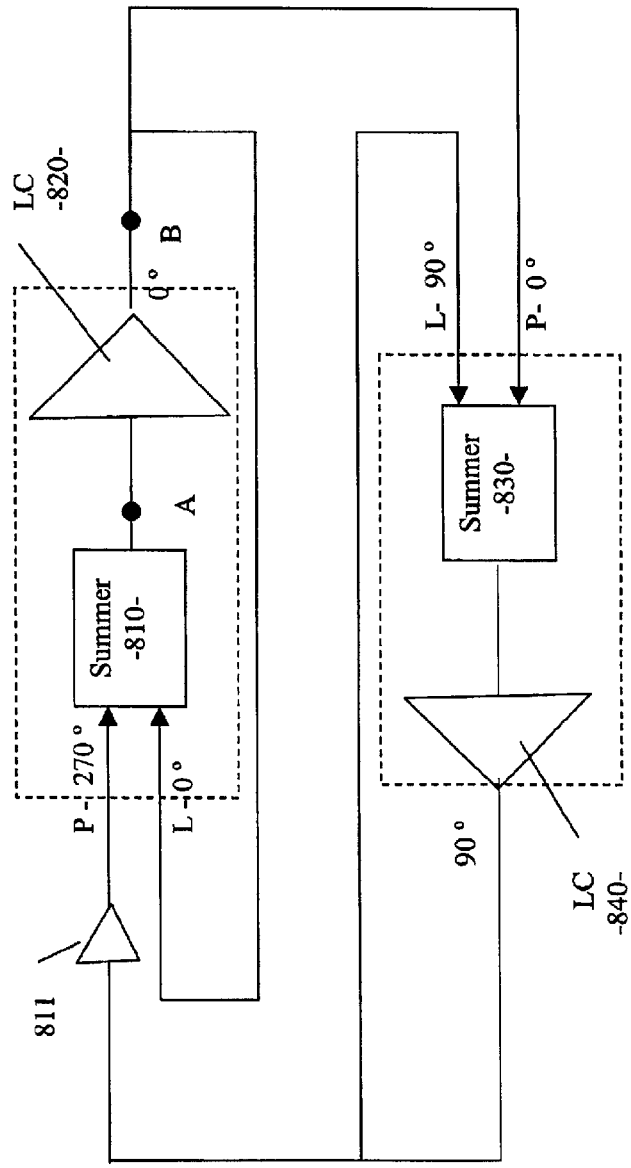
FIG. 8 illustrates a simplified diagram of an exemplary quadrature LC ring oscillator in accordance with one embodiment of the present invention.

Reference is now turned to FIG. 8, where a simplified diagram of an exemplary quadrature LC ring oscillator in accordance with one embodiment of the present invention is shown. Variable mixer 810, also known as "variable summer," has its output connected to the input of LC oscillator 820. LC oscillator 820 has its output fed back to variable mixer 810 and to the input of variable mixer 830. Variable mixer 830 has its output applied to the input of LC oscillator 840, which has its output fed back to variable mixer 830 and to the input of variable mixer 810, through inverter 811. The input signals to each of the variable mixers 810, 830 are quadrature, i.e. 90° phase-shifted from one another. As shown, the input signals to variable mixer 810 are 270° and 0°, while the inputs to variable mixer 830 are 90° and 0°.

Of course, those skilled in the art can readily design different combinations of quadrature inputs to the variable mixers based on the teachings of the present invention. For example, the phase of L of the variable mixer 830 can be any number (whether a whole number or a fraction) and the phase of P of the variable mixer 830 merely needs to be +/- about 90° of the phase of L of the variable mixer 830. The phase of the output of the LC oscillator 820 will be about the same as that of P of the variable mixer 830. The phase of the output of the LC oscillator 840 will be about the same as that of L of the variable mixer 830. The L of the variable summer 810 will be about the same as the output of the LC oscillator 820. The P of the variable summer 810 will be substantially an inverted signal (e.g., +/- about 180°) of the output of the LC oscillator 840.

The invention may be practiced in accordance with various other embodiments. For example, the three blocks shown as 811, 810 and 820 can be combined into one block or two blocks, and the two blocks shown as 840 and 830 may be combined into one block. The five blocks 811, 810, 820, 830, and 840 may be combined into one, two, three or four blocks. The three blocks 811, 810 and 820 may be repeated in series or in parallel. The two blocks 830 and 840 may also be repeated in series or in parallel. The invention may be practiced in various configurations. The invention may be practiced with single ended or differential lines. The output of the oscillator (or a clock generator) shown in FIG. 8 may be taken from, among others, L and P of the summer 830. LC oscillators 820 and 840 are resonating elements and each may include an inductor and a capacitor according to one embodiment of the present invention. In another embodiment, it may not include any inductor or a capacitor.

Figure 9:
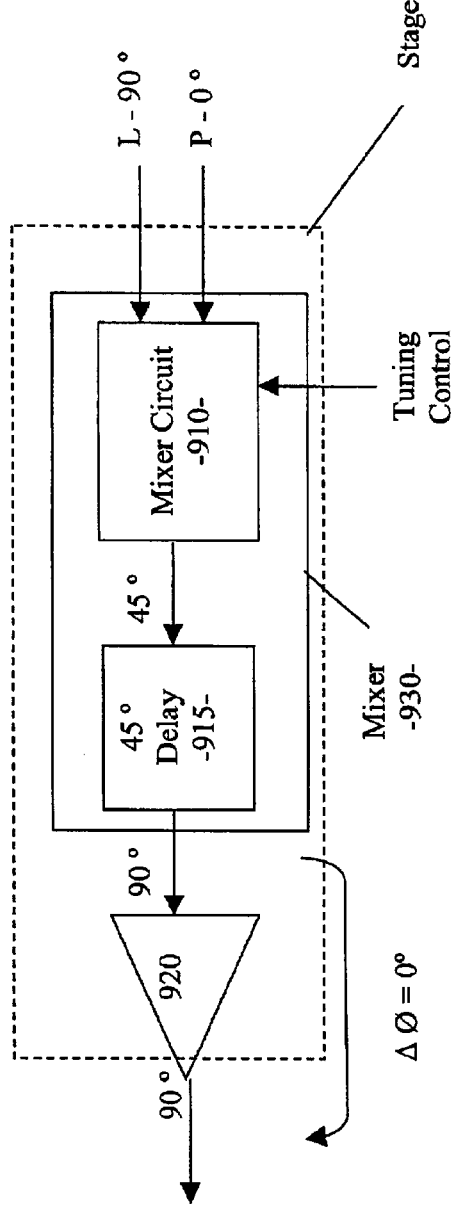
FIG. 9 illustrates a simplified stage diagram of an exemplary resonator and mixer in accordance with one embodiment of the present invention.
Figure 10:
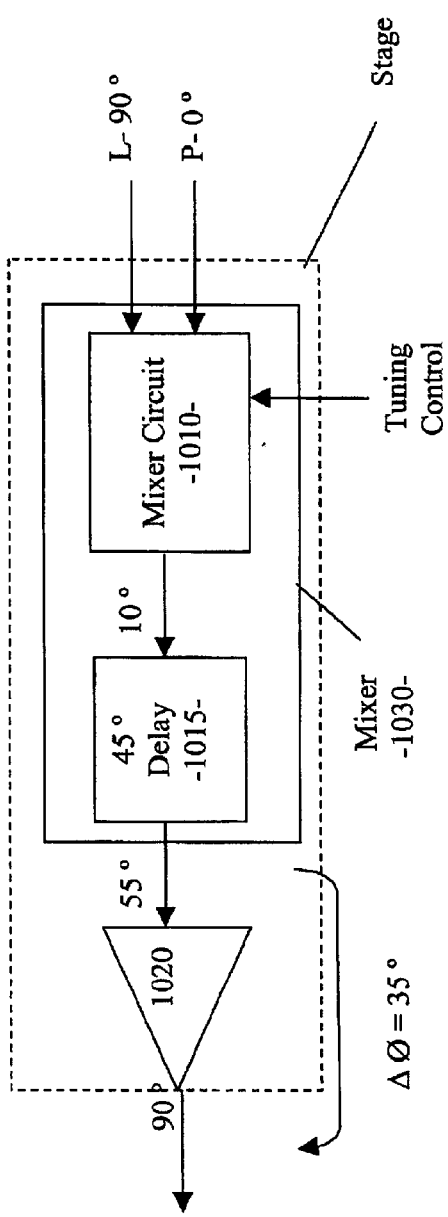

To take a closer look at variable mixers 810, 830 and LC oscillators 820, 840, reference is directed to FIG. 9, where a simplified stage of LC oscillator 920 and mixer circuit 930 is shown. A variable mixer, such as variable mixer 930, may be designed to have an inherent delay of 45°, or any degree of inherent delay, which is symbolically represented by delay block 915. In another instance, mixer 930 may be designed without any delay. At an operating frequency of, for example, 20 GHz (Period T=50 ps), the delay is 6.25 ps, because delay=50 ps·(45°/360°). By controlling its tuning, mixer circuit 910 may be adjusted to output a 45° phase change based on its "L" input of 90° and "P" input of 0°. This 45° output is then inherent delay 915 for another 45°, resulting in a mixer output of exactly 90°. This 90° mixer output is then applied to the input of LC oscillator 920. Since LC oscillator 920 generates a quadrature output that is 90° from the output of another stage, which is also the "P" input to this stage, the phase difference, i.e. $\Delta\varnothing$, is 0 between input and output of LC oscillator 920. For $\Delta\varnothing=0$, the Q-Point can be maintained at the nominal operating frequency, as previous shown in the frequency-$\Delta\varnothing$ curve of FIG. 7.

Figure 10:
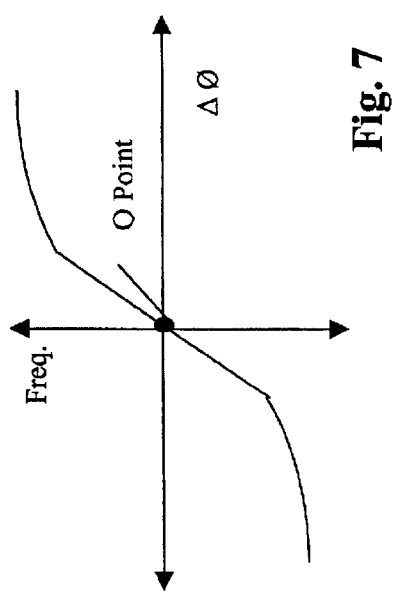
FIGS. 10(a) and (b) illustrate a simplified stage diagram of an exemplary resonator and mixer, and its frequency-vs.-phase difference graph for a different operating frequency.

To achieve a different operating frequency, the phase difference $\Delta\varnothing$ maybe changed, as illustrated in the simplified diagram and graph of FIGS. 10(*a*) and 10(*b*), respectively. In the stage diagram of FIG. 10(*a*), by tuning mixer circuit 1010, it can generate a different, e.g., 10°, output, which is again delayed by the inherent delay for another 45°, resulting in a mixer output of 55°, i.e. 10 degrees +45 degrees. This 55° signal is applied to LC oscillator 1020, resulting in a $\Delta\varnothing$ of 35°, since LC oscillator 1020 outputs a signal that is 90° from the output of another stage, or the "P" input to this stage. As shown in the frequency-$\Delta\varnothing$ characteristic curve of FIG. 10(*b*) (which is, for example, a frequency-$\Delta\varnothing$ characteristic curve of an LC oscillator 1020), a $\Delta\varnothing$ of 35° will cause the LC oscillator to achieve a higher operating frequency, since the Q-Point is now moved away from its nominal position. Therefore, by controlling the phase of the mixer output, the frequency of an LC oscillator can be altered, because of the resulting phase change, $\Delta\varnothing$.

Blocks 810 and 820 of FIG. 8 may be replaced by blocks 1010, 1015 and 1020 of FIG. 10(*a*), and blocks 830 and 840 of FIG. 8 may be also replaced by blocks 1010, 1015, and 1020 of FIG. 10(*a*) in accordance with one embodiment of the present invention. It should be noted that the phase of the output of mixer circuit 1010 may be any number, and the delay 1015 may produce any delay or no delay in accordance with another embodiment of the present invention. The phase of the output of mixer 1030 may be any number depending on, among others, the tuning control (which is typically a predetermined voltage), the output of mixer circuit 1010, and the delay 1015. The frequency of oscillation may be determined by, among others, the tuning control, the output phase produced by mixer 1030 (e.g., the output of mixer circuit 1010 and the output of delay 1015), and the inductor and capacitor values of oscillator 1020.

Figure 11:
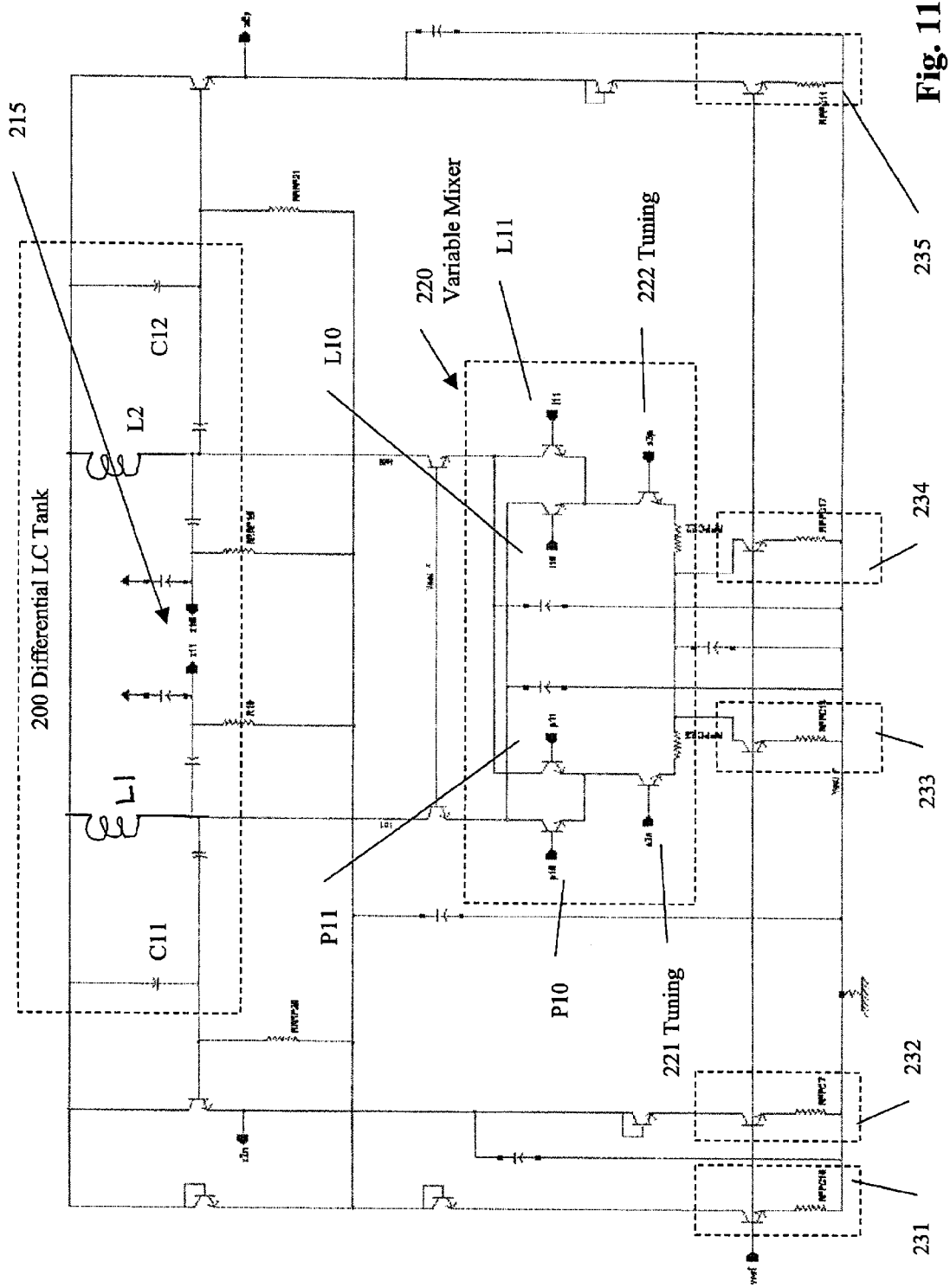
FIG. 11 illustrates a schematic diagram of an exemplary stage of a differential LC tank with variable mixer in accordance with one embodiment of the present invention.

Variable mixers and LC oscillators may be integrated into one VCO circuit, as well as with fully differential signals, in accordance with one embodiment of the present invention. An exemplary integrated circuit schematic diagram of a differential LC tank and variable mixer is shown in FIG. 11. Differential LC tank 200 is connected to a variable mixer 220. Variable mixer 220 has input P10 and P11 to be connected from the output of another stage. It also has input L10 and L11 to be connected from the output of the same stage. Output signals 215 are differential signals generated for this stage of differential LC tank 200 and variable mixer 220. Tuning control 221, 222 controls the phase shift of variable mixer 220. Current sources 231, 232, 233, 234, and 235 provide the necessary current to drive this stage of VCO circuit, which may be implemented with two stages of the circuit shown in FIG. 11 in accordance with one embodiment of the present invention. In operation, variable mixer 220 may generate current which charges the capacitors of differential LC tank 200.

The present invention includes various features and advantages including, without limitation, those described above and the following. For example, it may provide a clock rate that is about the same as the data rate (i.e., full rate) or a fraction of the data rate. If the invention is used to provide a clock rate that is substantially the same as the data rate, then one of the outputs of the oscillator (e.g., L or P of summer 830 in FIG. 8) may be utilized. If the invention is used to provide a clock rate that is substantially half the data rate, then both outputs of the oscillator (e.g., L and P of summer 830 in FIG. 8) may be utilized in accordance with one embodiment of the present invention. If it is desired to provide a clock rate that is about a quarter of the data rate, then an oscillator or a clock generator may need to provide four outputs.

The invention produces quadrature outputs (e.g., L and P of summer 830 in FIG. 8 are about 90° from each other) and employs a symmetric design in accordance with one embodiment. While the invention may utilize a varactor, one embodiment of the present invention requires no varactor which is noisy and lossy and which can limit the frequency range that an oscillator can achieve. Furthermore, the invention may provide linear tuning curves (e.g., see FIG. 6(*b*)). The tuning range can be also very large. For example, while a prior art tuning range may be limited to 10%, the invention may provide a 30% tuning range (e.g., 20 GHz +/−6 GHz). Depending on the application, there is a tradeoff between the phase noise and the tuning range. For example, the tuning range can be further increased if the phase noise requirement is lax. The invention may also increase the tuning range by utilizing the band switching ability. For example, additional capacitors (e.g., FETs or varactors) can be installed in parallel with C11 and C12 in FIG. 11. By turning on or off some or all of the additional capacitors, a different tuning curve band in FIG. 12 (e.g., 1200*a*, 1200*b*, 1200*c*, 1200*d*) can be selected, increasing the tuning range.

While the present invention has been particularly described with reference to the various figures and embodiments, it should be understood that these are for illustration purposes only and should not be taken as limiting the scope of the invention. There may be many other ways to implement the invention. Many changes and modifications may be made to the invention, by one having ordinary skill in the art, without departing from the spirit and scope of the invention.

For example, while the schematic in FIG. 11 shows a bipolar implementation, the present invention is not limited to that configuration. The present invention may be implemented using other techniques including without limitation a FET (e.g., MOSFET, JFET), or BiCMOS, HEMT technology. According to one embodiment of the present invention, an oscillator of the present invention can be manufactured using a Si—Ge technology. But the invention can also be made using other materials, including without limitation, other semiconductor materials such as silicon or III–materials (e.g., InP, GaAs, InGaAs). While certain frequencies have been referenced as an illustration, the invention is not limited to any particular frequency. In addition, the invention can be applied to both digital and analog applications. While one embodiment of the present invention may not utilize any variable inductor or a variable capacitor (e.g., varactor), another embodiment of the present invention may utilize a variable inductor and/or a variable capacitor. While the invention is described with reference to a phase shift or a phase difference, it may be described with reference to a time delay, time shift or time difference.

What is claimed is:

1. An oscillator comprising:
   a first resonating element having an input and an output;
   a second resonating element having an input and an output, said second resonating element for generating an output that is a quadrature phase shift of said output of said first resonating element;
   a first summer coupled to said first resonating element and said second resonating element, said first summer being adapted to selectively generate its output at a first phase shift;
   a second summer coupled to said second resonating element, said second summer being adapted to selectively generate its output at a second phase shift;
   an inverter coupled to said first resonating element and said second summer, said inverter being adapted to invert an input to generate an output.

2. An oscillator of claim 1, wherein said first and second resonating elements are varactor-less oscillators.

3. An oscillator of claim 1, wherein each of said first and second resonating elements comprises a fixed value capacitor and a fixed value inductor,
   wherein each of said first and second resonating elements is adapted to achieve a predetermined operating frequency based on a phase difference between its output and input.

4. An oscillator of claim 1, wherein said first summer comprises inputs,
   wherein one of said inputs of said first summer is coupled to said output of said second resonating element,
   wherein a second one of said inputs of said first summer is coupled to said output of said first resonating element,
   wherein said inputs of said first summer are quadrature inputs,
   wherein outputs of said oscillator are said inputs of said first summer.

5. An oscillator of claim 1, wherein said second summer comprises inputs,
   wherein one of said inputs of said second summer is coupled to said output of said second resonating element,
   wherein a second one of said inputs of said second summer is coupled to said output of said inverter,
   wherein said inputs of said second summer are quadrature inputs.

6. An oscillator of claim 1, wherein said first summer comprises a delay element.

7. An oscillator of claim 1, wherein said first summer is adapted to receive a tuning control signal.

8. An oscillator of claim 4, wherein said first phase shift is between a phase of said one of said inputs of said first summer and a phase of said second one of said inputs of said first summer.

9. An oscillator of claim 1, wherein said quadrature phase shift is substantially plus or minus 90° of said output of said first resonating element,
   wherein said quadrature phase shift is a time delay,
   wherein said first phase shift is a time delay,
   wherein said second phase shift is a time delay.

10. An oscillator of claim 1, wherein said first summer is adapted to produce an inherent delay.

11. An oscillator of claim 3, wherein said first resonating element further comprises a second capacitor, said second capacitor for being selectively turned on or off,
    wherein said second resonating element further comprises a third capacitor, said third capacitor for being selectively turned on or off.

12. An oscillator of claim 1 for generating an output of at least 15 GHz.

13. An oscillator of claim 3, wherein said predetermined operating frequency of said first resonating element is determined based further on (i) a value of said fixed value capacitor, (ii) a value of said fixed value inductor, and (iii) a value of a control input to said first summer.

14. A clock generator comprising:
    a first resonating element with an input and an output, said first resonating element being adapted to generate said output with a first predetermined phase;
    a phase adjustor having an input and an output, said input of said phase adjustor connected to said output of said first resonating element, said output of said phase adjustor connected to said input of said first resonating element, said phase adjustor being adapted to selectively generate its output with a second predetermined phase,
    wherein said phase adjustor comprises:
       a first variable summer having inputs and an output, one of said inputs of said first variable summer connected to said output of said first resonating element, said output of said first variable summer connected to said input of said first resonating element, said first variable summer being adapted to selectively generate its output with a first phase in response to said inputs of said first variable summer;
       a second variable summer having inputs and an output, one of said inputs of said second variable summer connected to said output of said first resonating element, said second variable summer being adapted to selectively generate its output with a second phase in response to said inputs of said second variable summer;
       a second resonating element having an input and an output, said input of said second resonating element connected to said output of said second variable summer, said output of said second resonating element connected to a second one of said inputs of said second variable summer, said output of said second resonating element coupled to a second one of said inputs of said first variable summer.

15. A clock generator of claim 14, wherein said phase adjustor further comprises:
    an inverter having an input and an output, said output of said second resonating element coupled to said second one of said inputs of said first variable summer through said inverter, said input of said inverter connected to said output of said second resonating element, said output of said inverter connected to said second one of said inputs of said first variable summer.

16. A clock generator of claim 14, wherein:

said inputs of said first variable summer are quadrature inputs;

said inputs of said second variable summer are quadrature inputs.

17. A clock generator of claim 14, wherein:

said inputs of said first variable summer have a phase of about 0° and 270°;

said inputs of said second variable summer have a phase of about 90° and 0°.

18. A system comprising:

a clock recovery and demultiplexer unit;

said clock recovery and demultiplexer unit comprising:
- a first resonating element with an input and an output, said first resonating element having a variable operating frequency determined in response to a phase difference between said output and said input;
- a phase adjustor having an input and an output, said input of said phase adjustor connected said output of said first resonating element, said output of said phase adjustor connected to said input of said first resonating element, said phase adjustor being adapted to selectively generate its output with a first phase.

19. A system of claim 18, wherein said first resonating element is a varactor-less oscillator.

20. A system of claim 18, wherein said first resonating element comprises a fixed-value capacitor and a fixed-value inductor.

21. A system of claim 18, wherein said phase adjustor comprises:
- a first variable summer having inputs and an output, one of said inputs of said first variable summer connected to said output of said first resonating element, said output of said first variable summer connected to said input of said first resonating element, said first variable summer being adapted to selectively generate its output with said first phase in response to said inputs of said first variable summer;
- a second variable summer having inputs and an output, one of said inputs of said second variable summer connected to said output of said first resonating element, said second variable summer being adapted to selectively generate its output with a second phase in response to said inputs of said second variable summer;
- a second resonating element having an input and an output, said input of said second resonating element connected to said output of said second variable summer, said output of said second resonating element connected to a second one of said inputs of said second variable summer;
- an inverter having an input and an output, said input of said inverter connected to said output of said second resonating element, said output of said inverter connected to a second one of said inputs of said first variable summer.

22. A system of claim 21, wherein:

said inputs of said first variable summer are quadrature inputs;

said inputs of said second variable summer are quadrature inputs.

23. A system of claim 21, wherein:

said inputs of said first variable summer have a phase of about 0° and 270°;

said inputs of said variable summer have a phase of about 90° and 0°.

24. An oscillator of claim 1, each of said first and second resonating elements for receiving differential input signals and for generating differential output signals, each of said first and second summers for receiving differential input signals and for generating differential signals.

* * * * *